US008723204B2

(12) United States Patent
De Carvalho Esteves et al.

(10) Patent No.: US 8,723,204 B2
(45) Date of Patent: May 13, 2014

(54) POLYMERIC WAVELENGTH CONVERTING ELEMENTS

(75) Inventors: Ana C. De Carvalho Esteves, Eindhoven (NL); Roel Copic, Eindhoven (NL); Gijsbertus De With, Valkenswaard (NL); Chrysostomus H. M. Maree, Geldrop (NL); Niels Van Der Veen, Geldrop (NL); Josephina C. M. Brokken-Zijp, Liempde (NL); Jozua Laven, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 180 days.

(21) Appl. No.: 13/062,981

(22) PCT Filed: Sep. 11, 2009

(86) PCT No.: PCT/IB2009/053978
§ 371 (c)(1),
(2), (4) Date: Mar. 9, 2011

(87) PCT Pub. No.: WO2010/032179
PCT Pub. Date: Mar. 25, 2010

(65) Prior Publication Data
US 2011/0156081 A1 Jun. 30, 2011

(30) Foreign Application Priority Data
Sep. 16, 2008 (EP) .................................... 08164400

(51) Int. Cl.
*H01L 29/22* (2006.01)
(52) U.S. Cl.
USPC ......... 257/98; 257/79; 257/103; 257/E33.061

(58) Field of Classification Search
USPC ................... 257/79, 98, 103, E33.061
See application file for complete search history.

(56) References Cited

U.S. PATENT DOCUMENTS

| 7,361,938 B2 * | 4/2008 | Mueller et al. ................ 257/94 |
| 2004/0145308 A1 | 7/2004 | Rossner et al. |
| 2007/0278935 A1 | 12/2007 | Harada |

FOREIGN PATENT DOCUMENTS

EP   1947670 A2   7/2008

OTHER PUBLICATIONS

Xu et al., "Oxygen Sensors Based on Luminescence Quenching: Interactions of Metal Complexes with the Polymer Supports", 1994, pp. 4133-4141, vol. 66, No. 23, Harrisonburg, Virginia.
Duggal et al., "Organic Light-Emitting Devices for Illumination Quality White Light", 2002, pp. 3470-3472, American Institute of Physics.

* cited by examiner

*Primary Examiner* — Andy Huynh
(74) *Attorney, Agent, or Firm* — Mark L. Beloborodov

(57) ABSTRACT

A wavelength converting element (104), typically for a LED (101), is provided, comprising luminescent particles (105) dispersed in a matrix (106) comprising crosslinked polysiloxane. Crosslinked polysiloxanes are temperature stable, typically up to temperatures above 300° C., meaning that they are stable under normal operating conditions of light emitting diodes. Further, crosslinked polysiloxanes are stable towards exposure to light, meaning that they will not degrade/discolor as a consequence of high intensity light exposure. The polymeric wavelength converter can easily be shaped in different forms. This may lead to better outcoupling of the light from a LED-converter system.

6 Claims, 3 Drawing Sheets

POLYMERIC WAVELENGTH CONVERTING ELEMENTS

FIELD OF THE INVENTION

The present invention relates to wavelength converting elements, methods for the manufacture thereof and to light emitting devices utilizing such wavelength converting elements.

BACKGROUND OF THE INVENTION

Light emitting diodes (LEDs) are emerging as alternatives to classical lighting devices, such as fluorescent tubes and light bulbs, in many applications for lighting devices. The development of high-power LEDs with high light output has expanded the areas of use of LEDs for conventional lighting purposes.

Due to its construction and mechanism of function, an LED emits light within a rather narrow wavelength band, and conventional LEDs, for instance, emit light in the UV, blue, green, red or IR-band.

In conventional lighting applications, "white" light is often desired, and several approaches has been developed in order to convert the monochromic light of LEDs into white light. In one approach, light from red, green and blue emitting diodes is mixed into white light. In another approach, a light emitting diode, typically a blue emitting diode, is provided with a wavelength converting material that partially converts the emitted light into another color. For example, by providing a blue emitting LED with a yellow emitting wavelength converting material that converts a desired portion of the blue light into yellow, the mixture of unconverted, blue light and converted, yellow light results in a whitish light.

This latter approach of wavelength converted LEDs has proven as an attractive way of achieving the desired color of the output light.

There are several requirements on wavelength converting materials for use in these type of applications.

High power LEDs dissipate a lot of thermal energy while emitting high intensity light, and a wavelength converting material arranged on or near such an LED needs to be thermally stable and also light stable in order to ensure long life-time and consistent color throughout the life-time of the device.

Further, the degree of the wavelength conversion is dependent on the concentration of active substances in the wavelength converting material, and also on the thickness of the material. Hence, the thickness and the concentration should be able to be controlled accurately.

A ceramic wavelength converting element is described in US 2004/0145308 A1, the element being formed from a polycrystalline ceramic body of an yttrium aluminum garnet (YAG) which is doped with an activator, such as cerium.

However, the number of ceramic materials available for the manufacture of such wavelength converting elements are quite low, limiting the possibilities to fine-tune the wavelength conversion. Further, sintering of ceramic materials is performed at very high temperatures, which is detrimental to many luminescent materials, e.g. organic species.

In addition, accurate post production shaping of ceramic wavelength converting elements is difficult.

Thus there is a need for new materials for the manufacture of temperature and photo stable wavelength converting elements.

SUMMARY OF THE INVENTION

It is an object of the present invention to at least partly overcome the problems of the prior art, and to provide an alternative material for wavelength converting elements.

The present inventors have surprisingly found that crosslinked polysiloxanes is a suitable matrix material for wavelength converting elements holding luminescent particles.

Luminescent particles can be dispersed in a polysiloxane which thereafter is crosslinked to form a solid body. In the crosslinked (both are accepted, just use always the same form) polysiloxane, it is possible to keep the luminescent particles are essentially homogenously distributed while avoiding agglomeration of luminescent particles or phase-separation. Especially, this can be obtained without use of surfactants or modification of the luminescent particle surface. Hence, in a first aspect, the present invention relates to a wavelength converting element, comprising luminescent particles dispersed in a matrix comprising crosslinked polysiloxane.

A wavelength converting element of the present invention may be formed into a self-supporting element, which can be manufactured and thereafter arranged for its use in separate steps. Alternatively, the wavelength converting element may be formed "in-situ" such as directly on the surface of a light emitting diode. Further, due to the solid and robust state of the wavelength converting polymer element, the thickness can easily be adjusted to a desired value, during the processing step (i.e. controlling spin-coating parameters).

Furthermore the polymers used have initial viscosity values which facilitate the good dispersion of the particles with no need of surfactants or particles surface modification, and can afford polymer converters with a homogeneous distribution of the individual luminescent particles throughout the polymer converter element.

Crosslinked polysiloxanes are temperature stable, typically up to temperatures above 300° C., meaning that they are stable under normal operating conditions of light emitting diodes.

Crosslinked polysiloxanes are further stable towards exposure to light, meaning that they will not degrade/discolor as a consequence of high intensity light exposure.

The polymeric wavelength converter can easily be shaped in different forms. This may lead to better outcoupling of the light from a LED-converter system.

Further, the wavelength converting elements of the present invention has an inherent elasticity, rendering them a good capability to withstand thermal stresses, for example due to differing coefficients of thermal expansion between the wavelength converting element and a light emitting diode. The elasticity of the present wavelength converting elements is also advantageous since the shape of the element can be manipulated, such as bended, if needed so that it conforms to a desired substrate on which it is to be arranged.

In embodiments, the wavelength converting element may comprise at least a first sub-layer comprising a first luminescent material and a second sublayer comprising a second luminescent particles.

For several applications it is advantageous to utilize a first wavelength converting element for a first wavelength conversion, and thereafter a second wavelength converting element for a second, different wavelength conversion. By arranging different luminescent materials in different sublayers of the same matrix, any undesired optical effects and delamination in interfaces between separate elements can be avoided. Also further sublayers, with or without luminescent particles may be added to this structure.

In embodiments of the present invention, said matrix comprises crosslinked poly(dimethyl siloxane).

Crosslinked PDMS has shown excellent properties in terms of thermal and photo stability and also in terms of capability to hold high concentration of luminescent material uniformly distributed in the matrix while avoiding agglomeration of luminescent particles and phase-separation. Further PDMS is a relatively cheap material leading to the possibility of low cost mass-manufacture of wavelength converting elements.

In embodiments of the present invention said luminescent particles are ceramic particles.

Ceramic particles are known to be hard to distribute evenly in polymeric matrices. The proposed crosslinked polysiloxane matrix has however been demonstrated to have a capability of holding large amounts of ceramic particles homogeneously and separately distributed in the polymer matrix.

In embodiments of the present invention, the surface of said particles is of a ceramic material.

The crosslinked polysiloxane matrix is capable of holding luminescent particles, especially ceramic luminescent particles, homogenously and separately distributed without additional surface active agents or particles surface modifications. This obviates the need for pre-processing surface modification of the luminescent particles In a second aspect, the present invention relates to a light emitting device, comprising a light emitting diode and a wavelength converting element of the present invention arranged to receive light emitted from said light emitting diode.

In embodiments of the invention, the wavelength converting element is arranged on the light emitting surface of the light emitting diode, optionally by means of a bonding material.

In alternative embodiments, the wavelength converting element and the light emitting diode are arranged mutually spaced apart.

In a third aspect, the present invention relates to a method for the manufacture of a wavelength converting element, said method comprising providing a dispersion comprising at least luminescent particles dispersed in a crosslinkable polysiloxane; and crosslinking said dispersion to obtain a solid wavelength converting element.

The method allows for the separate manufacture of wavelength converting elements which at a later stage can be arranged on light emitting diodes. Adding the luminescent particles to the polysiloxane polymer before crosslinking gives a well controlled concentration and dispersion of the luminescent particles in the wavelength converting element.

The method also allows for cross-linking of the dispersion directly on a substrate, such as the light emitting surface of an LED, thereby obtaining a good optical bond between the LED and the wavelength converting element without the need for a bonding material.

In embodiments, the polysiloxane comprises a di-vinyl functional poly(dimethyl siloxane).
Further, the dispersion may further comprise a crosslinking agent, such as for example, but not limited to tetrakis(dimethylsiloxy)silane.

In embodiments, the dispersion is deposited a layer on a substrate before effecting said crosslinking dispersion.

In embodiments of the invention, the dispersion is mould to a desired shape before crosslinking said dispersion.

In embodiments of the invention, the method comprises: providing a first dispersion of luminescent particles in a cross-linkable polysiloxane and a second dispersion of luminescent particles in a cross-linkable polysiloxane; depositing a first layer of said first dispersion; crosslinking said first dispersion; depositing a second layer of said second dispersion on said first layer; and crosslinking said second dispersion.

In a fourth aspect, the present invention relates to a method for the manufacture of a light emitting device, comprising providing a light emitting diode; and arranging a wavelength converting element according to the present invention or manufactured according to a method of the present invention to receive at least part of the light emitted by said light emitting diode.

It is further noted that the invention relates to all possible combinations of features recited in the claims.

BRIEF DESCRIPTION OF THE DRAWINGS

These and other aspects of the present invention will now be described in more detail, with reference to the appended drawings showing currently preferred embodiments of the invention.

DETAILED DESCRIPTION

Figure 1:
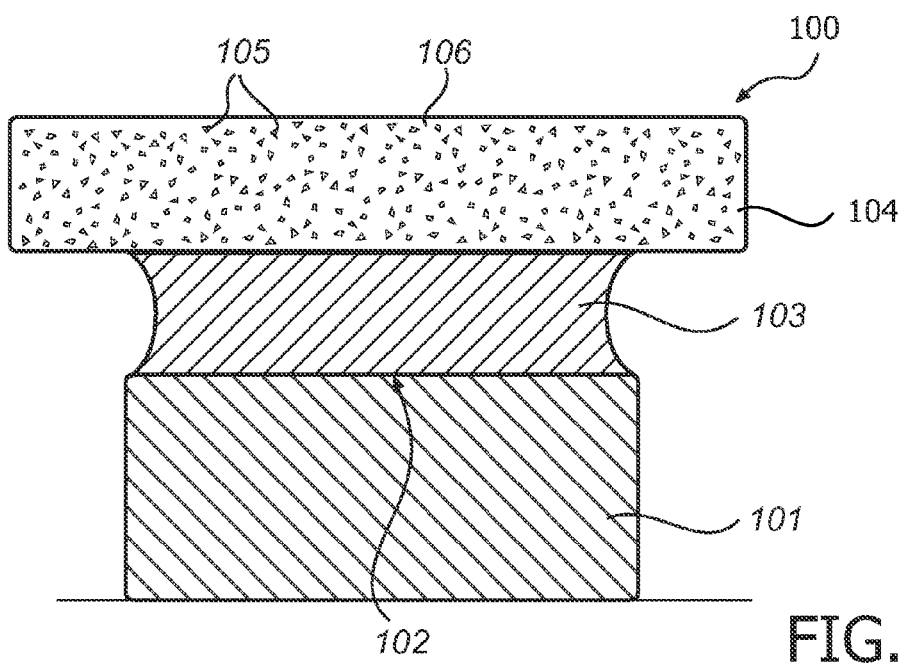
FIG. 1 illustrates a light emitting device of the present invention.

One embodiment of a light emitting device 100 of the present invention is illustrated schematically in FIG. 1, and comprises a light emitting diode (LED) 101 having an upwards directed main light emitting surface 102. A wavelength converting element 104 of the present invention is arranged on the light emitting surface 102, optionally by means of an optically transmissive bonding material 103.

In alternative embodiments, the wavelength converting element 104 may be arranged at a certain distance, remote, from the LED 101. For example, a wavelength converting element of the present invention may be placed at a distance from one or more LEDs, such as e.g. forming an output window of a lamp. It will be realized that also such embodiments are encompassed by the scope of the claims.

The LED 101 emits light through its light emitting surface 102, via the optional bonding material 103, into the wavelength converting element 104. A first portion of the LED-light, unconverted light, is absorbed by the luminescent material in the wavelength converting material and is re-emitted as light, converted light, having a different wavelength distribution from that of the unconverted light. Typically, the converted light is red-shifted in respect to the unconverted light, even though there also exist luminescent materials that lead to a blue-shift.

A second portion of the unconverted light passes unconverted through the wavelength converting element, and thus a mixture of converted and unconverted light exits the wavelength converting element. It is to be noted that for example if the concentration of luminescent material is very high, or if the thickness of the wavelength converting element is very high, the portion of unconverted light passing through the wavelength converting element can be 0 or at least close to 0.

In embodiments, the light emitting diode 101 emit light in or near the blue light range, and the wavelength converting element is capable of converting such blueish light into yellow light. A mixture of blue and yellow light results in white light.

As used herein, the term "light emitting diode" refers to any kind of light emitting diodes known to those skilled in the art, such as, but not limited to, inorganic based LEDs, polymeric based LEDs (PLEDs) and organic based light emitting diodes (OLEDs).

The wavelength converting element 104 comprises luminescent particles 105 distributed, such as dispersed, in a matrix material 106 of a crosslinked polysiloxane. This results in a solid wavelength converting element with well-controlled concentration of luminescent particles.

The concentration of luminescent particles in the matrix material is selected in order to achieve a desired degree of light conversion for a certain thickness of the wavelength converting element. Concentrations of luminescent material up to about 30% (v/v) are possible to achieve while maintaining a uniform distribution of the luminescent particle in the matrix. Typically, the concentration of luminescent material is in the range of 3 to 30% (v/v), such as in the range of from 5 to 20%.

The term "luminescent particles" as used herein refers particles of any luminescent material with fluorescent and/or phosphorescent properties that are suitable for use in the present application. The luminescent particles may be a single material or may be a mixture of two or more of such particles. Non-limiting examples of luminescent particles include both inorganic and organic luminescent particles.

Typical examples include ceramic luminescent particles, such as, but not limited to lanthanoid activated lutetium, yttrium and/or gadolinium aluminum garnets of the following general formula:

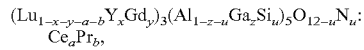

wherein 0≤x≤1, 0≤y≤1, 0<z≤0.1, 0≤u≤0.2, 0<a≤0.2 and 0<b≤0.1, such as $Lu_3Al_5O_{12}:Ce^{3+}$ (LuAG:Ce) and $Y_3Al_5O_{12}:Ce^{3+}$ (YAG:Ce) and other luminescent materials known to those skilled in the art, such as ceramic phosphors of the following general formula:

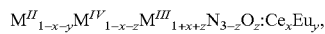

with $M^{II}$ being selected out of the group comprising Ca, Sr, Mg, Ba, Zn, Yb, Mn; $M^{IV}$ being selected out of the group comprising Si, Ge, C, Zr, Hf, and $M^{III}$ being selected out of the group comprising Al, B, Sc, Ga, and Lu, such as $CaAlSiN_3:Eu$.

The luminescent particle in the wavelength converting element are chosen to match the emission wavelength of the light emitting diode, so that the luminescent particles are capable of converting a desired part of the unconverted light.

As will be realized by those skilled in the art, the luminescent particles in a wavelength converting element of the present invention may be a plurality of particles having essentially the same chemical composition or may represent a mixture of two or more types of luminescent particles, having different chemical composition. A mixture of two or more types of luminescent particles may be used to tune both the excitation wavelength range and the emission wavelength band, so that the desired light output, in terms of perceived color, is obtained.

One advantageous property of the present invention is that the proposed polysiloxane matrix is capable of holding the luminescent particles separately dispersed and homogenously distributed without the need for any surface modification of the luminescent particles or surfactants. Hence, when it comes to ceramic luminescent particles, they may have a ceramic, i.e. unmodified, surface.

The matrix 106 comprises a crosslinked polysiloxane, in which the photoluminescent material 105 is distributed.

A polysiloxane is a polymerized siloxane with functional sidechains. Representative examples include poly(dimethyl siloxane) PDMS and poly(diphenylsiloxane) PDPS, although other polysiloxanes are also encompassed by the scope of the present invention.

In order for the polysiloxanes to be crosslinkable, it is typically required a reactive functionality on the polysiloxane. For example, the polysiloxanes may be vinyl terminated or hydroxyl terminated.

Crosslinked polysiloxanes have been shown to have a capability to hold large amounts of ceramic particles, such as the above mentioned aluminum garnets, without agglomeration or deposition of the particles. Hence, this matrix material has been shown to be an excellent choice for use in wavelength converting elements.

Typically, the crosslinked polysiloxane is a crosslinked poly(dimethyl siloxane) (crosslinked nPDMS, with 4<n<500, typically 4<n<270). It has been shown that PDMS is especially well suited as matrix material for use in the present invention as it exhibits high resistance towards temperature and light exposure. The nPDMS polymers also show initial viscosity levels which make them very attractive to disperse individually and homogenously the luminescent particles, without the use of surface active agents and no need of performing modifications on the surface of the particles to improve the compatibility.

A method for the manufacture of a wavelength converting element of the present invention will now be described in general terms.

A reaction mixture comprising polysiloxane, crosslinking agent, luminescent material and a catalyst solution is spread out on a substrate to a desired thickness, such as by conventional coating methods, for example doctor blade coating, spin coating, etc. Suitable substrates include, but are not limited to thermoplastic substrates such as polycarbonate, crosslinked PE or PMMA, as well as glass, sapphire and silicon.

Crosslinking is effected in the spread out reaction mixture to form a solidified layer of crosslinked polysiloxane matrix in which the luminescent particles are separated and homogenously distributed.

Typically, the polysiloxane and the luminescent particles are pre-mixed before the addition of the crosslinking agent and catalyst solution to the reaction mixture. The means for effecting crosslinking in the spread out reaction mixture will depend on the initiator/catalyst type and concentration, the type and concentration of the crosslinker and temperature (e.g. step-curing at different values), but the crosslinking is typically effected by application of heat for a prolonged period of time.

If needed, the substrate may be removed to form a self-supporting wavelength converting element of the present invention, and the solidified layer may be easily divided into a plurality of wavelength converting elements of a desired size.

Due to fact that the luminescent material is homogeneously distributed in the matrix material, the thickness of the wavelength converting element may be adjusted to a desired value, by controlling the processing parameters (i.e. spin-coating conditions, or addition of solvents).

The polysiloxane in the reaction mixture may be represented by essentially linear poly(dimethyl siloxane) such as di-functional vinyl terminated poly(dimethyl siloxane), formula I.

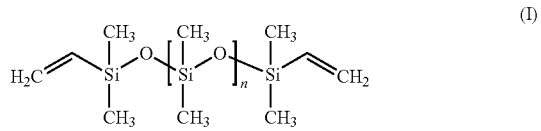
(I)

The polysiloxane has typically, but is not limited to, an average molecular weight from 500 to 40 000 g/mol, typically 500 to 20 000 g/mol, (n varying between about 4 and about 500, typically between about 4 and about 270), depending on the particles size, concentration of the luminescent particles, mixing method, etc)

The crosslinking agent may be, but is not limited to, a tetra-functional crosslinker, such as, tetrakis(dimethylsiloxy)silane, formula II. Other multifunctional crosslinkers (e.g. tri, penta or hexafunctional) can also be used to obtain the crosslinked PDMS matrices, and form different crosslinked networks.

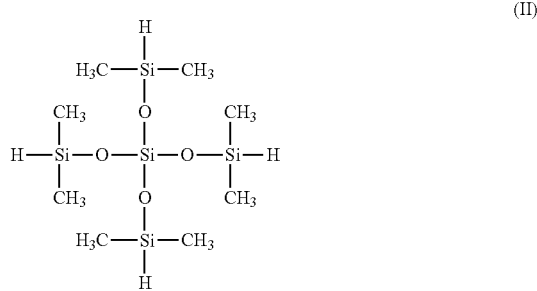 [SMILES: C[SiH](C)O[Si](O[SiH](C)C)(O[SiH](C)C)O[SiH](C)C]
(II)

Tetrakis(dimethylsiloxy)silane is a crosslinker suitable for vinyl-terminated polysiloxanes. Crosslinking agents suitable for hydroxy-terminated polysiloxanes include multifunctional siloxanes, such as tetraethoxysilane (TEOS).

The crosslinking agent is added to an effective amount within, but not limited to, crosslinker to PDMS ratios (H/V) from 1 to 3.7, to yield the desired crosslinking in the reaction mixture. The temperature value (between room temperature and 120° C.) and cycles (one to three steps) used to effect the crosslinking should be adjusted to the H/V ratio and catalyst amount used.

Catalysts suitable for use in this systems includes, but are not limited to platinum catalysts, such as cis-dichlorobis(diethylsulphide)platinum(II). Other Pt catalysts mentioned in the related literature (i.e. Karstedt's or Speiers catalyst), can be used to perform the hydrosilylation reaction and be equally efficient on the crosslinking of the current polymeric system.

The Pt(II) catalyst is typically added in a solvent, such as toluene, typically from 5 to 20 ppm of Pt (II), to effect the desired crosslinking of the reaction mixture.

All the experimental conditions are advantageously adjusted to obtain a polymeric matrix with a crosslinking degree as high as possible. This will afford polymeric materials more robust and with no unreacted residues (which could trigger secondary reactions and have undesired consequences, like yellowing or phase separation).

It is advantageous to utilize the above presented approach of di-vinyl-terminated polysiloxanes together with tetrakis (dimethylsiloxy)silane, or other dimethylsiloxy based crosslinking agents, as a cross-linker as the crosslinking will be a hydrosiliation reaction, resulting in cross-linked PDMS with essentially hydrogen as side-product. Hence, this reaction is very clean, resulting in only low amounts of residual matter in the end product.

Further, the polysiloxane start products are liquid on their own, and thus need not to be dissolved in a solvent. This also results in a clean end product, and essentially no solvent is needed to be evaporated from the cross-linked end product.

In one, basic, embodiment, the wavelength converting element comprises a single layer of matrix material with an essentially uniform distribution of the luminescent particles.

Figure 2:
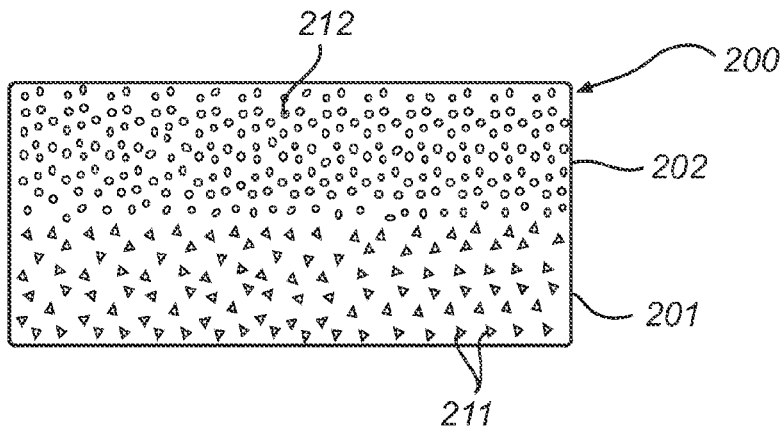
FIG. 2 illustrates a multilayer embodiment of a wavelength converting element of the present invention.

However, alternative embodiments are also encompassed by the scope of the present invention. For example, it is possible to obtain a wavelength converting element 200 which is illustrated in FIG. 2 of the present invention, which is comprised by at least two superpositioned sublayers 201 and 202 wherein there is a difference in the luminescent particle composition between the first and the second sublayer. For example, the first sublayer 201 may comprise a first luminescent particle composition 211, and the second sublayer 202 may comprise a second luminescent particle composition 212.

In the context of the present invention, a first and a second luminescent particle composition may differ in terms of chemical composition, in terms of blending ratio between two or more luminescent particle species in a mixture, or in terms of concentration in the matrix.

Such a wavelength converting element 200 may be manufactured by preparing two separate reaction mixtures as described above, each comprising polysiloxane, crosslinking agent, luminescent particles and catalyst, but where the luminescent material, its concentration and/or the composition (if the luminescent material comprises a mixture of two or more species of luminescent particles) varies between the two reaction mixtures.

As above, the first reaction mixture is spread out on a substrate, but before final crosslinking, optionally after an intermediate crosslinking of the spread out first reaction mixture, the second reaction mixture is spread out on top of the first reaction mixture, whereafter final crosslinking is effected in both layers.

The two layers will bond strongly to each other by interlayer crosslinking to form an excellent optical bond, and the interface as such between the two sublayers will not to an appreciable extent affect the optical properties of the wavelength converting element.

Figure 3:
FIG. 3 illustrates a stack of separate wavelength converting elements

As will be realized by those skilled in the art, and as is illustrated in FIG. 3, it is also possible to separately manufacture two or more wavelength converting elements 301 and 302, having the same or different properties in terms of matrix material and/or luminescent material content, and superposition elements, optionally arranging a bonding material between the two (or more) elements (not shown).

The person skilled in the art realizes that the present invention by no means is limited to the preferred embodiments described above. On the contrary, many modifications and variations are possible within the scope of the appended claims. For example, it is possible to arrange a wavelength converting element of the present invention to receive the light from more than one light emitting diode.

Also, it is possible to introduce further components into the wavelength converting elements, such as scattering particles, absorbing dyes, etc. It is also possible to use other shapes than the flat plates discussed above and shown in the figures. The wavelength converting elements of the present invention may be shaped into different shapes, such as domes, pyramids or the like, without deviating from the scope of the present invention. This may lead to better outcoupling of the light from a LED-converter system. These shapes may be formed directly during the processing, such as by moulding the dispersion and crosslinking the dispersion in the mold, or later by cutting in smaller elements or making several crosslinking steps to achieve the desired layers or shapes.

Experiments

Manufacture of Wavelength Converting Element

For all the experiments a linear di-functional vinyl-terminated poly(dimethylsiloxane) (PDMS) (ABCR GmbH & Co, $M_w$=17 200 g/mol) was crosslinked with the four-functional siloxane, tetrakis(dimethylsiloxane) (ABCR GmbH & Co). The hydrosilylation reactions between the Si—H groups of the crosslinker and the vinyl groups of PDMS, were catalyzed by cis-dichlorobis(diethylsulphide) platinum (II) catalyst (Strem Chemicals, Inc,) previously dissolved in a toluene solution (typically 20 ppm of Pt (II) relatively to the PDMS polymer), and carried out in a vacuum oven. The crosslinking conditions are adjusted to the crosslinker and catalyst type and amount, but typically it was used H/V ratio of 3.7, 20 ppm of Pt(II) from a toluene solution of the catalyst ($5.3 \times 10^{-3}$ mol/L) at one step temperature program, at 60° C.

Experiment 1

Manufacture of Single Layer Wavelength Converting Elements

Two dispersions of the YAG:Ce particles with mean particle size of 3.5 μm, in the PDMS vinyl-terminated pre-polymer was prepared with 10 and 20% v/v, respectively, of the luminescent particles. The dispersions were stirred by hand for approximately 5 minutes and mixed in a roller bank for 2 hours to obtain a homogenous dispersion.

After the mixing period, the crosslinker was added to each of the mixtures according to a Si—H to vinyl groups ratio H/V of about 3.7 (as high crosslinking as possible is targeted), and the dispersion was stirred for approximately 5 minutes. The Platinum (II) catalyst, previously dissolved in toluene, was added to each of the mixtures (20 ppm of $Pt^{II}$ relatively to the PDMS pre-polymer in 1 mL of a toluene solution) which then was stirred by hand for another 5 minutes.

After all the mixing steps, each of the dispersions were finally spread on Poly(carbonate) substrates (PC) using a spin-coater equipment with different spinning conditions depending on the targeted thickness for the polymer converters.

Finally the coatings were placed in an oven under vacuum at 60° C., for approximately 18 hours to finalize the crosslinking.

After cooling down, the crosslinked PDMS-based polymer converters were easily removed by the hand from the PC subtrate.

Figure 4A:
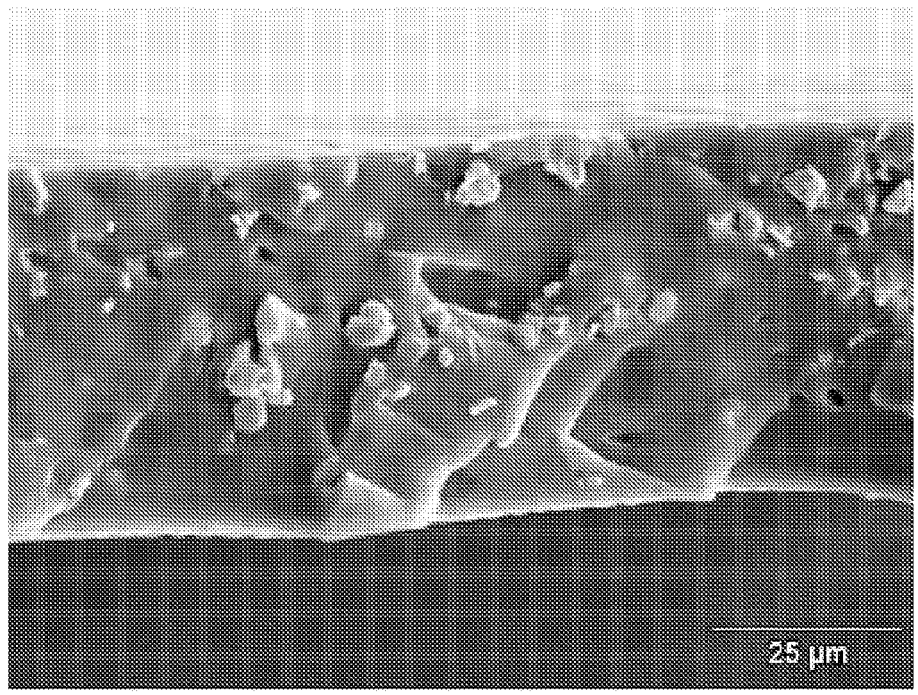
FIGS. 4a and b depicts SEM images of wavelength converting elements of the present invention.
Figure 4B:
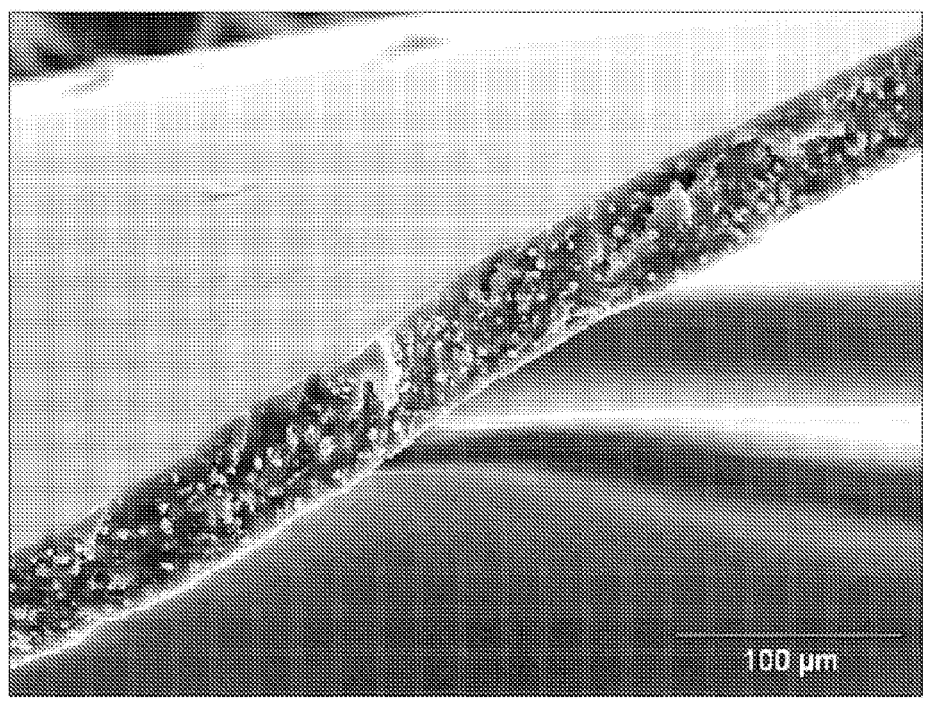

Inspection of the polymer converters by means of SEM (scanning electron microscope) and confocal microscopy characterization reveals an essentially uniform distribution of the luminescent particles throughout and over the polymer converter. FIG. 4a represents a SEM image of the polymer converter comprising 10% v/v of YAG:Ce luminescent particles while FIG. 4b represents a SEM image of the polymer converter comprising 20% v/v of YAG:Ce luminescent particles.

Experiment 2

Manufacture of Multilayer Wavelength Converting Element

Two dispersions of the luminescent particles, 10% v/v YAG:Ce-particles with mean particle size of 3.5 μm and 5% v/v CaAlSiN$_3$:Eu-particles respectively, in the PDMS vinyl-terminated pre-polymer were prepared.

The dispersions were stirred by hand for approximately 5 minutes and mixed in a roller bank for 2 hours to obtain a homogenous dispersions.

After the mixing period, the crosslinker was added to the YAG:Ce containing mixture according to H/V ratio of 3.7, and the dispersion was stirred for approximately 5 minutes. The Platinum (II) catalyst, previously dissolved in toluene, was added to the mixture (20 ppm of $Pt^{II}$ relatively to the PDMS pre-polymer in 1 mL of toluene).

Following the same procedure described above, a second layer of PDMS was spread and pre-crosslinked on the top of the first layer containing the YAG:Ce particles for 30 minutes more, in a vacuum oven at 60° C. Finally, a third layer, the mixture containing the CaAlSiN$_3$:Eu particles was spread and crosslinked on top of the second PDMS layer. The final three-layer converter was left in a vacuum oven at 60° C. for 24 hours, to finalize the crosslinking.

After cooling down, the crosslinked multilayered PDMS-based polymer converter was easily removed by the hand from the PC substrate.

Inspection of the multilayered converter by means of SEM (scanning electron microscope) and confocal microscopy characterization reveals an essentially uniform distribution of luminescent particles throughout and over the plates within each sublayer of the multilayer plates, and no segregation effect is visible at the interface between the layers with different phosphors.

Figure 5A:
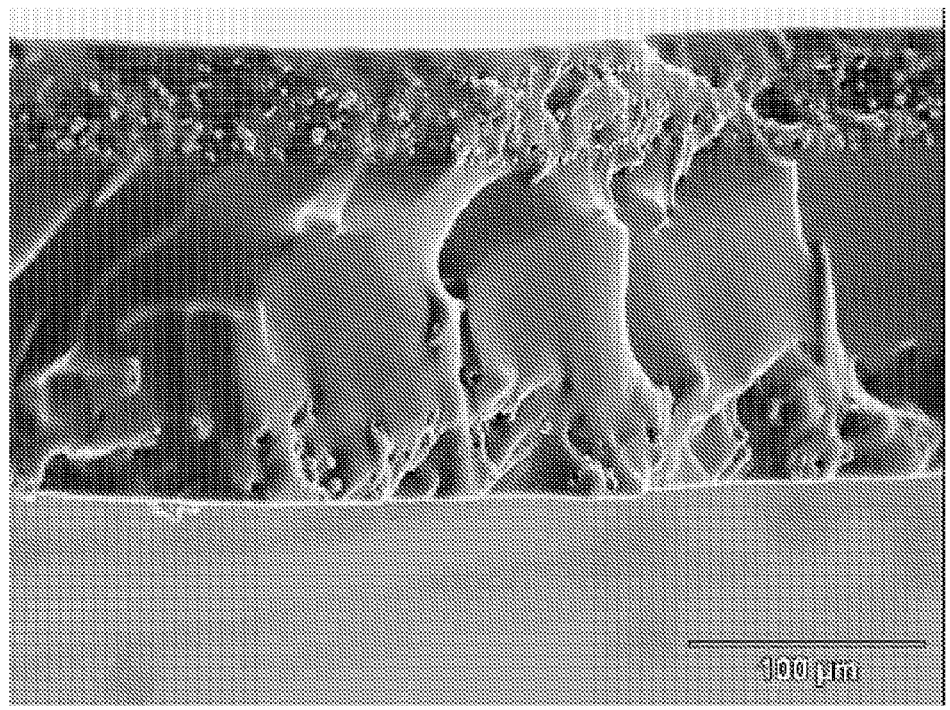
FIGS. 5a and b depicts SEM images of wavelength converting elements of the present invention.
Figure 5B:
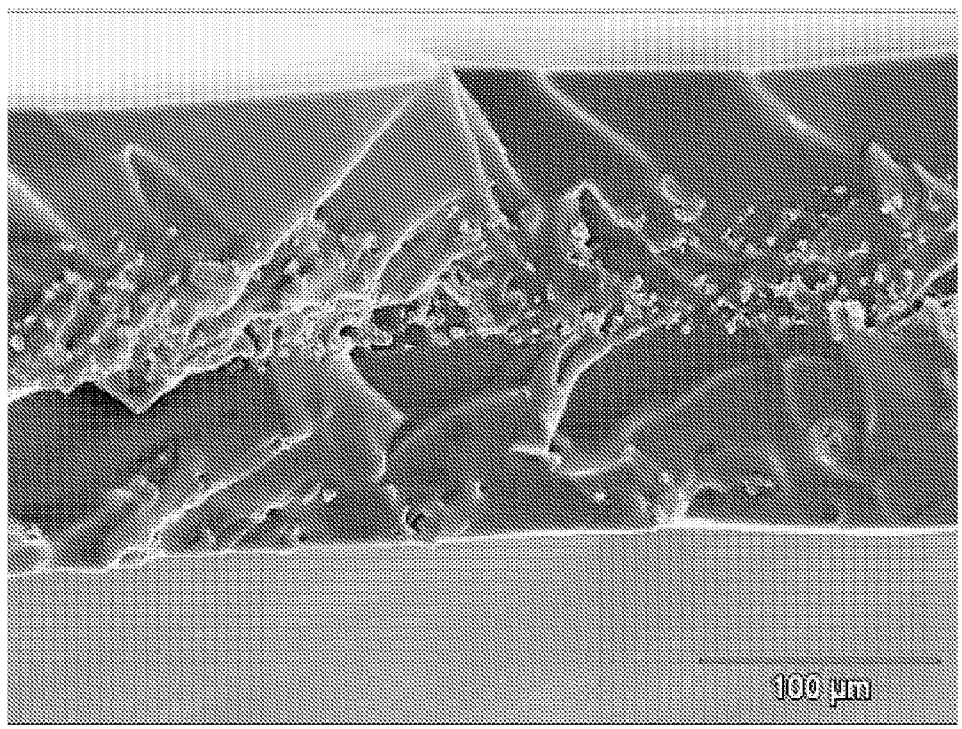

FIG. 5a represents a SEM image of an example of a multilayer polymer converter with the following arrangement: 10% v/v YAG:Ce—PDMS with no particles—5% v/v CaAlSiN$_3$:Eu; while FIG. 5b represents a SEM image of an example of a multilayer polymer converter comprising the following arrangement: PDMS with no particles—10% v/v YAG:Ce—5% v/v CaAlSiN$_3$:Eu.

Stability Tests

Experiment 3

Stability and Degradation Tests

Degradation tests were carried out (by accelerating the degradation using a combination of a heating plate and a light source—set up called as turbodegrador) over the single layer polymer converter with 10 and 20% v/v of YAG:Ce luminescent particles, presented in FIG. 4 a and b. The experiments were made at normal air and moisture atmosphere, in a temperature range from 180-300° C., under visible light irradiation (150 W directed to an area of ~3 mm in the converter element) and for long operation periods.

The performance of the crosslinked PDMS polymer converter proved to be very stable under the extreme conditions tested. For example, for the converters presented in FIG. 4 a and b, no visible degradation was observed up to 21 days, at 300° C., 150 W of visible light and under normal air and moisture conditions.

FTIR spectroscopy characterization of the samples submitted to degradation has shown no chemical changes in the polymer matrix, which would be expected for degradation. However, some changes were identified in relation to the type of crosslinks present in the polymer network, which can be due to additional crosslinks promoted by the temperature.

TGA (thermorgravimetric) analysis of the crosslinked PDMS materials with and without particles up to 900° C., under air and Nitrogen flow, have also shown that the degradation process does not start until above 300° C. Furthermore, it should be noticed that the major final products of degradation of PDMS-based materials are $CO_2$, $H_2O$ and mainly a $SiO_2$ residue, which is one of the most abundant oxide materials in nature. Hence, the possible degradation products produced at high temperatures (>300° C.) are environmentally safe.

The invention claimed is:

1. A wavelength converting element comprising luminescent particles dispersed in a matrix comprising crosslinked poly(dimethyl siloxane), wherein said luminescent particles are ceramic particles.

2. A wavelength converting element according to claim 1, wherein the surface of said particles is of a ceramic material.

3. A light emitting device, comprising a light emitting diode and a wavelength converting element according to claim 1 arranged to receive light emitted from said light emitting diode.

4. A light emitting device according to claim 3, wherein said wavelength converting element is arranged on a light emitting surface of said light emitting diode.

5. A light emitting device according to claim 3, wherein said wavelength converting element and said light emitting diode are arranged mutually spaced apart.

6. A wavelength converting element according to claim 1, comprising at least a first sub-layer comprising a first luminescent particle composition and a second sublayer comprising a second luminescent particle composition.

* * * * *